United States Patent
Kitano et al.

(10) Patent No.: US 6,638,642 B2
(45) Date of Patent: Oct. 28, 2003

(54) COPPER FOIL EXCELLENT IN LASER BEAM DRILLING PERFORMANCE AND PRODUCTION METHOD THEREFOR

(75) Inventors: Kouji Kitano, Ibaraki (JP); Mikio Hanafusa, Ibaraki (JP)

(73) Assignee: Nikko Materials Company, Limited, Tokyo (JP)

(*) Notice: Subject to any disclaimer, the term of this patent is extended or adjusted under 35 U.S.C. 154(b) by 39 days.

(21) Appl. No.: 10/169,965

(22) PCT Filed: Dec. 4, 2000

(86) PCT No.: PCT/JP00/08578

§ 371 (c)(1),
(2), (4) Date: Jul. 11, 2002

(87) PCT Pub. No.: WO01/58225

PCT Pub. Date: Aug. 9, 2001

(65) Prior Publication Data

US 2003/0031888 A1 Feb. 13, 2003

(30) Foreign Application Priority Data

Feb. 3, 2000 (JP) .......................... 2000-26174

(51) Int. Cl.[7] .................. B23K 26/00; B23K 26/38; B32B 3/10; B32B 15/20; C25D 5/48
(52) U.S. Cl. .................. 428/607; 428/596; 428/637; 428/674; 427/98; 427/554
(58) Field of Search .................. 428/607, 596, 428/637, 674; 427/554, 98

(56) References Cited

U.S. PATENT DOCUMENTS

| | | | |
|---|---|---|---|
| 5,019,222 A | 5/1991 | Hino et al. | 204/27 |
| 5,567,534 A | 10/1996 | Yano et al. | 428/607 |
| 6,346,678 B1 | 2/2002 | Kono et al. | 174/255 |
| 6,362,436 B1 * | 3/2002 | Kimbara et al. | 174/260 |

FOREIGN PATENT DOCUMENTS

| | | |
|---|---|---|
| JP | 02-292894 | 12/1990 |
| JP | 07-278883 | 10/1995 |
| JP | 08-269738 | 10/1996 |
| JP | 09-087888 | 3/1997 |
| JP | 10-018075 | 1/1998 |
| JP | 11-266068 | 9/1999 |
| JP | 11-354901 | 12/1999 |
| JP | 2000-252609 | 9/2000 |

OTHER PUBLICATIONS

Patent Abstracts of Japan, One page English Abstract of JP 11–354901.
Patent Abstracts of Japan, One page English Abstract of JP 02–292894.
Patent Abstracts of Japan, One page English Abstract of JP 07–278883.
Patent Abstracts of Japan, One page English Abstract of JP 10–018075.
Patent Abstracts of Japan, One page English Abstract of JP 09–087888.
Patent Abstracts of Japan, One page English Abstract of JP 11–266068.
Patent Abstracts of Japan, One page English Abstract of JP 08–269738.
Patent Abstracts of Japan, One page English Abstract of JP 2000–252609.

* cited by examiner

Primary Examiner—John J. Zimmerman
Assistant Examiner—Jason Savage
(74) Attorney, Agent, or Firm—Howson and Howson

(57) ABSTRACT

A copper foil with excellent laser drilling property, having a layer containing any one or more substances selected from indium, tin, cobalt, zinc, cobalt alloys, and nickel alloys on the face of the copper foil to be radiated with laser beams. A copper foil easy to be laser-processed and suitable for forming through hole and via hole with a small diameter at the time of manufacturing a printed circuit board and a method for manufacturing such a copper foil are achieved by improving the surface of a copper foil.

21 Claims, No Drawings

COPPER FOIL EXCELLENT IN LASER BEAM DRILLING PERFORMANCE AND PRODUCTION METHOD THEREFOR

FIELD OF THE INVENTION

The present invention relates to a copper foil excellent in laser punchability with which an copper layer connection hole (through hole and via hole) of a printed circuit board can efficiently be formed and also relates to a method for manufacturing such a copper foil.

The copper foil of the present invention includes not only a copper foil alone but also all kinds of copper-laminated boards and build-up laminated board on which copper is directly formed (including electroplated and electroless plated ones)

BACKGROUND OF THE INVENTION

A drill has been employed for forming a small diameter hole (through hole) for copper layer connection of a printed circuit board. Since burrs have easily been formed in the processing (forming holes) by a drill and opening of a hole with an ultra small diameter has been limited, however, a method for forming a hole by laser has been employed recently.

However, a copper foil has a disadvantageous point that the surface of the copper foil conventionally employed for a printed circuit board has a high reflectance to result in inferior processibility with laser beams. Therefore, a method for forming a hole by removing a prescribed copper foil part by etching and then forming a hole by radiating laser beams to the part or a method for forming a hole by thinning a copper foil by chemical polishing and then processing with laser beams have been employed.

In these cases, however, since a step of removing a copper foil by etching or of chemical processing is employed, efficiency has been deteriorated and also since strict control is required for operation of such processing procedures, productivity is lowered and the cost is heightened.

OBJECTS OF THE INVENTION

The present invention has been achieved while taking the foregoing problems into consideration. The purposes of the present invention are to provide a copper foil excellent in drilling property by laser and suitable for forming through hole and via hole with a small diameter and also to provide a method for manufacturing such a copper foil by improving the surface of a copper foil at the time of manufacturing a printed circuit board.

SUMMARY OF THE INVENTION

As described above, the present invention provides the following copper foils:

1. A copper foil excellent in drilling property by laser, having a layer containing any one or more substances selected from indium, tin, cobalt, zinc, cobalt alloys, and nickel alloys on the face to be radiated with laser beams;
2. a copper foil excellent in drilling property by laser as set forth in the above described item 1, having cobalt alloys layer containing at least one of nickel, phosphorus, zinc and copper;
3. a copper foil excellent in drilling property by laser as set forth in the above described item 1, having nickel alloys layer containing at least one of copper, zinc, and phosphorus;
4. a copper foil excellent in drilling property by laser as respectively set forth in the above described items 1 to 3, in which content of cobalt, nickel, tin, zinc, or indium is independently 0.1 to 100 mg/dm$^2$ (provided that, zinc content is 0.5 to 100 mg/dm$^2$); and
5. a copper foil excellent in drilling property by laser as respectively set forth in the above described items 1 to 4, in which thickness of the copper foil is 18 μm or thinner.

The present invention further provides the following methods for manufacturing a copper foil excellent in drilling property by laser:

6. A method for manufacturing a copper foil excellent in drilling property by laser, in which a layer containing any one or more substances selected from indium, tin, cobalt, zinc, cobalt alloys, and nickel alloys is formed on the face to be radiated with laser beams;
7. a method for manufacturing a copper foil excellent in drilling property by laser as set forth in the above described item 6, in which cobalt alloys layer containing at least one of nickel, phosphorus, zinc and copper is formed;
8. a method for manufacturing a copper foil excellent in drilling property by laser as set forth in the above described item 6, in which nickel alloys layer containing at least one of copper, zinc, and phosphorus is formed;
9. a method for manufacturing a copper foil excellent in drilling property by laser as respectively set forth in the above described items 6 to 8, in which the layer is formed by plating;
10. a method for manufacturing a copper foil excellent in drilling property by laser as respectively set forth in the above described items 6 to 9, in which content of cobalt, nickel, tin, zinc, or indium is independently 0.1 to 100 mg/dm$^2$ (provided that zinc content is 0.5 to 100 mg/dm$^2$);
11. a method for manufacturing a copper foil excellent in drilling property by laser as respectively set forth in the above described items 6 to 10, in which thickness of the copper foil is 18 μm or thinner;
12. a method for manufacturing a copper foil excellent in drilling property by laser as respectively set forth in the above described items 6 to 11, in which stabilizer treatment is carried out after the layer formation; and
13. a method for manufacturing a copper foil excellent in drilling property by laser as set forth in the above described item 12, in which the surface treated by the stabilizer treatment contains chromium and/or zinc.

DETAILED DESCRIPTION OF THE PREFERRED EMBODIMENTS

The present invention includes formation of a layer containing any one or more of substances selected from indium, tin, cobalt, zinc, cobalt alloys and nickel alloys in a position of a copper foil of a printed circuit board where through hole and via hole is to be formed by radiating laser beams thereto, and thereby drilling property by laser is significantly improved as compared with that of a conventional copper foil.

A copper foil used in the present invention may be an electrodeposited copper foil and a rolled copper foil. Further, the thickness of the copper foil is desirably 18 μm or thinner for the use in high density wiring.

Nevertheless, the thickness of a copper foil of the present invention with improved laser drilling property is not necessarily restricted within the defined thickness and may, of course, be thicker than the defined thickness.

A layer containing any one or more of substances selected from indium, tin, cobalt, zinc, cobalt alloys and nickel alloys is formed on the face of a copper foil to which laser beams is radiated.

Such a layer can be produced by plating treatment. However, the method is not limited to plating, but vapor deposition, sputtering, or other coating methods may be employed for the layer formation.

Further, even in the case plating treatment is employed, the plating treatment method is not at all restricted to a specified plating method. The layer formation by such a plating method can be carried out either partly on the face of a copper foil to be radiated with laser beams thereto or fully on the copper foil. Such a plating treatment is naturally required to be carried out without deteriorating the characteristic properties of a copper foil usable for a circuit board and any treatment of the present invention sufficiently satisfies such conditions.

In the foregoing alloy layers to be formed on a copper foil, cobalt alloys layer containing at least one of nickel, phosphorus, zinc, and copper is superior in drilling property by laser.

In the case of a nickel layer alone, the laser drilling rate is low as compared with that by the present invention, and even if the amount of nickel is increased, the drilling rate cannot be improved. The layer is thus unsuitable as a layer (coating layer) for improving the laser drilling property.

Incidentally, the drilling rates were 0%, 2%, 67%, 73%, 68%, and 71% in the case where the nickel deposition amount at 32 mJ/pulse was 3,400 $\mu g/dm^2$, 6,100 $\mu g/dm^2$, 13,400 $\mu g/dm^2$, 20,333 $\mu g/dm^2$, 53,600 $\mu g/dm^2$, and 81,333 $\mu g/dm^2$, respectively, and even when the nickel deposition amount was increased further, the drilling rate was hardly increased.

However, in the case where a nickel layer containing any one or more of copper, zinc, and phosphorus, that is nickel alloys layer containing these elements, is formed, the drilling rate can be improved approximately to the same level as that of the foregoing indium, tin, cobalt, zinc or cobalt alloy layer and more excellent laser drilling property can be achieved than that in the case of a layer of nickel alone. Consequently, the present invention includes the forgoing nickel alloy layer.

By the way, in the case of a low drilling rate as described above, it is of course possible to increase the drilling rate by heightening the laser output (energy) at the time of forming a hole.

However, if the laser energy is increased unnecessarily, a resin part of a board (copper-clad laminated board) is considerably damaged and it occurs that the hole diameter of the resin becomes wider than the diameter of a hole of a copper foil (layer)

If a hole of a resin is widened as described, the quality of a hole formed by laser is deteriorated including occurrence of detachment of the resin from the copper foil (layer) in the bottom part of the hole and further strict control of treatment conditions is required to prevent such quality deterioration, resulting in a big problem such as complication of processes and treatment operation.

Hence, it is generally better to carry out drilling efficiently with laser while laser energy is lowered as much as possible.

In terms of above described explanation, in the case of using common laser energy, the foregoing layer of nickel alone with a low drilling rate is not appropriate for a layer (coating layer) to improve the drilling property.

After plating treatment, stabilizer treatment with chromium and/or zinc may be carried out. Technique for the stabilizer treatment or a treatment liquid is not specifically limited. The stabilizer treatment may be carried out on the surface subjected to the foregoing plating treatment, that is, either partly on the face of a copper layer to which laser beams is radiated or on the whole surface of a copper foil.

As described above, the stabilizer treatment is naturally required not to deteriorate the characteristic properties of a copper foil to be employed for a circuit board and the stabilizer treatment of the present invention sufficiently satisfies those conditions. The stabilizer treatment scarcely affects the laser drilling property.

The following plating treatment methods are applicable for formation of a layer containing any one or more substances selected from indium, tin, cobalt, zinc, cobalt alloys and nickel alloys on the face to be radiated with laser beams in the present invention. The following are representative examples. The plating treatment methods described below are only kinds of preferable examples and the present invention is not at all restricted within those examples.

(Cobalt Plating Treatment)

Co concentration: 1 to 30 g/L,

Electrolytic solution temperature: 25 to 60° C., pH: 1.0 to 4.0, current density: 0.5 to 5 A/dm$^2$, Plating time: 0.5 to 4 seconds.

(Tin Plating Treatment)

Sn concentration: 5 to 100 g/L, sulfuric acid: 40 to 150 g/L

Electrolytic solution temperature: 25 to 40° C., pH: 1.0 to 4.0, current density: 1.0 to 5 A/dm$^2$, Plating time: 0.5 to 4 seconds.

(Indium Plating Treatment)

In concentration: 10 to 50 g/L, Sulfuric acid: 10 to 50 g/L

Electrolytic solution temperature: 20 to 40° C., pH: 1.0 to 4.0, Current density: 1.0 to 20 A/dm$^2$, Plating time: 0.5 to 4 seconds.

(Zinc-Cobalt Plating Treatment)

Zn concentration: 1 to 20 g/L, Co concentration: 1 to 30 g/L

Electrolytic solution temperature: 25 to 50° C., pH: 1.5 to 4.0, Current density: 0.5 to 5 A/dm$^2$, Plating time: 1 to 3 seconds.

(Copper-Nickel Plating Treatment)

Cu concentration: 5 to 20 g/L, Ni concentration: 5 to 20 g/L

Electrolytic solution temperature: 25 to 50° C., pH: 1.0 to 4.0, Current density: 10 to 45 A/dm$^2$, Plating time: 1 to 3 seconds.

(Copper-Cobalt Plating Treatment)

Cu concentration: 5 to 20 g/L, Co concentration: 5 to 20 g/L

Electrolytic solution temperature: 25 to 50° C., pH: 1.0 to 4.0, Current density: 10 to 45 A/dm$^2$, Plating time: 1 to 3 seconds.

(Zinc-Nickel Plating Treatment)

Zn concentration: 1 to 10 g/L, Ni concentration: 10 to 30 g/L

Electrolytic solution temperature: 40 to 50° C., pH: 3.0 to 4.0, Current density: 0.5 to 5 A/dm$^2$, Plating time: 1 to 3 seconds.

(Cobalt-Nickel Plating Treatment)

Co concentration: 5 to 20 g/L, Ni concentration: 5 to 20 g/L

Electrolytic solution temperature: 20 to 50° C., pH: 1.0 to 4.0, Current density: 0.5 to 10 A/dm$^2$, Plating time: 1 to 180 seconds.

(Copper-Cobalt-Nickel Plating Treatment)

Co concentration: 1 to 15 g/L, Ni concentration: 1 to 15 g/L, Cu concentration: 5 to 25 g/L Electrolytic solution temperature: 25 to 50° C., pH: 1.0 to 4.0, Current density: 1.0 to 30 A/dm$^2$, Plating time: 1 to 180 seconds.

(Copper-Phosphorus Plating Treatment)

Co concentration: 5 to 20 g/L, P concentration: 1 to 30 g/L

Electrolytic solution temperature: 20 to 50° C., pH: 1.0 to 4.0, Current density: 0.5 to 15 A/dm$^2$, Plating time: 1 to 180 seconds.

(Nickel-Phosphorus Plating Treatment)

Ni concentration: 5 to 20 g/L, P concentration: 1 to 30 g/L

Electrolytic solution temperature: 20 to 50° C., pH: 1.0 to 4.0, Current density: 0.5 to 15 A/dm$^2$, Plating time: 1 to 180 seconds.

The following plating treatment is applicable to the stabilizer treatment of the present invention. The following is a representative example. The stabilizer treatment described below is only one of preferable examples and the present invention is not restricted to the example.

(Chromium Stabilizer treatment)

$K_2Cr_2O_7$ ($Na_2Cr_2O_7$ or $CrO_3$): 2 to 10 μg/L,

NaOH or KOH: 10 to 50 g/L,

ZnO or $ZnSO_4$-$7H_2O$: 0.05 to 10 g/L, pH: 3.0 to 4.0, Electrolytic solution temperature: 20 to 80° C., Current density: 0.05 to 5 A/dm$^2$, Plating time: 5 to 30 seconds.

EXAMPLES

Next, the present invention will be described according to examples. These examples are only preferable ones and the present invention is not restricted within the examples. Consequently, any variation and other examples and embodiments are all included in the present invention as long as they are based on the basic technical ideas of the present invention.

Comparative examples are also provided below for a comparison with the present invention.

Example 1

A shiny side surface (S surface) of an electrodeposited copper foil with 12 μm thickness was subjected to the cobalt plating treatment in the foregoing plating conditions to form a coating layer with the following cobalt deposition quantity.

Cobalt deposition quantity: 5,060 μg/dm$^2$.

Example 2

A side surface (S surfaces) of an electrodeposited copper foil with 12 μm thickness was subjected to the tin plating treatment in the foregoing plating conditions to form a coating layer with the following tin deposition quantity.

Tin deposition quantity: 9,370 μg/dm$^2$.

Example 3

A shiny side surface (S surface) of an electrodeposited copper foil with 12 μm thickness was subjected to the indium plating treatment in the foregoing plating conditions to form a coating layer with the following indium deposition quantity.

Indium deposition quantity: 2,530 μg/dm$^2$.

Example 4

A side surface (S surface) of an electrodeposited copper foil with 12 μm thickness was subjected to the zinc-cobalt plating (an alloy plating, hereafter the same) treatment in the foregoing plating conditions to form a coating layer with the following cobalt and zinc deposition quantities.

Cobalt deposition quantity: 3,400 μg/dm$^2$ and zinc deposition quantity: 880 μg/dm$^2$.

Example 5

A shiny side surface (S surface) of an electrodeposited copper foil with 12 μm thickness was subjected to the copper-nickel plating treatment in the foregoing plating conditions to form a coating layer with the following nickel and copper deposition quantities.

Nickel deposition quantity: 3,400 μg/dm$^2$ and copper deposition quantity: 51,000 μg/dm$^2$.

Example 6

A shiny side surface (S surface) of an electrodeposited copper foil with 12 μm thickness was subjected to the copper-cobalt plating treatment in the foregoing plating conditions to form a coating layer with the following cobalt and copper deposition quantities.

Cobalt deposition quantity: 2,400 μg/dm$^2$ and copper deposition quantity: 44,800 μg/dm$^2$.

Example 7

A side surface (S surface) of an electrodeposited copper foil with 12 μm thickness was subjected to the cobalt-phosphorus plating treatment in the foregoing plating conditions to form a coating layer with the following cobalt and phosphorus deposition quantities.

Cobalt deposition quantity: 3,780 μg/dm$^2$ and phosphorus deposition quantity: 200 μg/dm$^2$.

Example 8

A shiny side surface (S surface) of an electrodeposited copper foil with 12 μm thickness was subjected to the nickel-phosphorus plating treatment in the foregoing plating conditions to form a coating layer with the following nickel and phosphorus deposition quantities.

Nickel deposition quantity: 1,920 μg/dm$^2$ and phosphorus deposition quantity: 100 μg/dm$^2$.

Example 9

A shiny side surface (S surface) of an electrodeposited copper foil with 12 μm thickness was subjected to the copper-cobalt-nickel plating treatment in the foregoing plating conditions, further subjected to cobalt-nickel plating treatment thereon to form a coating layer with the following copper-cobalt and nickel deposition quantities (respectively in total), and after that, the resultant foil was subjected to the stabilizer treatment in the foregoing conditions.

Copper deposition quantity: 19,000 μg/dm², cobalt deposition quantity: 3,400 μg/dm², nickel deposition quantity: 650 μg/dm², chromium deposition quantity: 43 μg/dm², and zinc deposition quantity: 6 μg/dm².

Example 10

A shiny side surface (S surface) of an electrodeposited copper foil with 12 μm thickness was subjected to the zinc-nickel plating treatment in the foregoing plating conditions to form a coating layer with the following nickel and zinc deposition quantities.

Nickel deposition quantity: 1,230 μg/dm² and zinc deposition quantity: 4,400 μg/dm².

Example 11

A shiny side surface (S surface) of an electrodeposited copper foil with 12 μm thickness was subjected to the cobalt-nickel plating treatment in the foregoing plating conditions to form a coating layer with the following cobalt and nickel deposition quantities.

Cobalt deposition quantity: 3,470 μg/dm² and nickel deposition quantity: 490 μg/dm².

Comparative Example 1

A shiny side surface (S surface) of an electrodeposited copper foil with 12 μm thickness was subjected only to the stabilizer treatment in the foregoing stabilizer treatment conditions. The chromium deposition quantity and the zinc deposition quantity in this case were as follows.

Chromium deposition quantity: 32 μg/dm² and zinc deposition quantity: 270 μg/dm².

Regarding specimens of the above described Examples 1 to 11 and the Comparative Example 1, one-side boards were produced using a prepreg (FR-4) from the 12 μm thick foils of which the shiny side surfaces(S surfaces) were subjected to the foregoing surface treatment. Laser beams were radiated to 100 spots for each specimen in the following conditions and the drilling rates were compared with one another. The results are shown in Table 1.

(Laser Radiation Conditions)
Employed apparatus: Carbon dioxide gas laser processing apparatus,
Spot size: 144 μmφ,
Pulse width: 32 μsec,
Frequency: 400 Hz, Shot number: 1 shot,
Energy: 7.5 mJ/pulse, 12.5 mJ/pulse, 20.9 mJ/pulse, 32 mJ/pulse, 43 mJ/pulse, 47.7 mJ/pulse, respectively.
(The results of the cases at 7.5 mJ/pulse, 43 mJ/pulse, and 47.7 mJ/pulse are not shown in the table.)

TABLE 1

| | Deposition quantity μg (mg)/dm² | | | | | | | | Drilling rate % | | |
|---|---|---|---|---|---|---|---|---|---|---|---|
| | P | In | Sn | Cr | Zn | Co | Ni | Cu | At 12.5 mJ/pulse | At 20.9 mJ/pulse | At 32 mJ/pulse |
| Example 1 | | | | | | 5060 | | | 2 | 74 | 100 |
| Example 2 | | | 9370 | | | | | | 67 | 93 | 100 |
| Example 3 | | 2530 | | | | | | | 31 | 85 | 100 |
| Example 4 | | | | | 3400 | 880 | | | 52 | 94 | 100 |
| Example 5 | | | | | | | 3400 | 51 (mg) | 99 | 100 | 100 |
| Example 6 | | | | | | 2400 | | 44.8 (mg) | 98 | 100 | 100 |
| Example 7 | 200 | | | | | 3780 | | | 75 | 99 | 100 |
| Example 8 | 100 | | | | | | 1920 | | 0 | 82 | 100 |
| Example 9 | | | | 43 | 6 | 3400 | 650 | 19 (mg) | 99 | 100 | 100 |
| Example 10 | | | | | 4400 | | 1230 | | 14 | 99 | 100 |
| Example 11 | | | | | | 3470 | 490 | | 1 | 80 | 100 |
| Comparative Example 1 | | | | 32 | 270 | | | | | | 9 |

In Example 1, the drilling rates were 2% and 74% at laser beams radiation energy of 12.5 mJ/pulse and 20.9 mJ/pulse, respectively, and reached 100% at 32 mJ/pulse. There was no problem in practical manufacture and excellent drilling rates were shown. Consequently, the cobalt plating was found effective to improve the drilling rates.

Also, as the cobalt deposition quantity was increased, the drilling rate was heightened, and in the case of exceeding 50,000 μg/dm², the drilling rate was 100% at 20.9 mJ/pulse. When the laser beams radiation energy was further increased, the 100% drilling rate was, of course, maintained. As described above, however, since it was supposed to affect other parts such as a insulated layer (resin) or the like and, it was not preferable to increase the output.

Thus, achievement of a drilling rate of 100% using a low laser beams radiation energy as exemplified in this example results in an extremely excellent effect on the improvement of the quality.

The drilling rate was slightly decreased as the thickness of a copper foil was increased, while the drilling rate was further increased as the thickness was decreased. The described correlation between the intensity of the laser beams radiation energy and the thickness of the copper foil can be said true for all of the Examples.

In Example 2, the drilling rates were 67% and 93% at laser beams radiation energy of 12.5 mJ/pulse and 20.9 mJ/pulse, respectively, and reached 100% at 32 mJ/pulse. There was no problem in practical manufacture and excellent drilling rates were shown. Consequently, the tin plating was found effective to improve the drilling rates.

Also, as in the Example 1, as the tin deposition quantity was increased, the drilling rate was heightened more, and in the case of exceeding 40,000 μg/dm², the drilling rate reached 100% even at 12.5 mJ/pulse.

In Example 3, the drilling rates were 31% and 85% at laser beams radiation energy of 12.5 mJ/pulse and 20.9 mJ/pulse, respectively, and reached 100% at 32 mJ/pulse. There was no problem in practical manufacture and excellent drilling rates were shown. Consequently, the indium plating was found effective to improve the drilling rates. Also, as in the Example 1, as the indium deposition quantity was increased, the drilling rate was heightened.

In Example 4, the drilling rates were 52% and 94% at laser beams radiation energy of 12.5 mJ/pulse and 20.9 mJ/pulse, respectively, and reached 100% at 32 mJ/pulse. There was no problem in practical manufacture and excellent drilling rates were shown. Consequently, the zinc-cobalt alloy plating was found effective to improve the drilling rates. Also, as in the Example 1, as the zinc-cobalt deposition quantity was increased, the drilling rate was heightened.

In Example 5, the drilling rates were 99% at laser beams radiation energy of 12.5 mJ/pulse and reached 100% at 20.9 mJ/pulse and 32 mJ/pulse and extremely excellent drilling rates were shown. Consequently, the nickel-copper alloy plating was found effective to improve the drilling rates.

Also, the drilling rate was further improved by only slightly increasing the copper-nickel deposition quantity, and drilling rate reached 100% at laser beams radiation energy of 12.5 mJ/pulse.

As described above, the copper-nickel alloy plating presented high drilling rates as compared with the plating described in other examples. It was supposedly attributed greatly to surface roughening by the copper-nickel alloy plating. According to that, it was found effective at improving the drilling rate to carry out roughening plating as to form nodule on the plated surface.

In Example 6, the drilling rates were 98% at laser beams radiation energy of 12.5 mJ/pulse and reached 100% at 20.9 mJ/pulse and 32 mJ/pulse and extremely excellent drilling rates were shown as same in the Example 5. Consequently, the cobalt-copper alloy plating was found effective to improve the drilling rates. Also, as in the Example 1, as the copper-cobalt deposition quantity was increased only slightly more, the drilling rate was heightened, and the drilling rate reached 100% at laser beams radiation energy of 12.5 mJ/pulse.

As described above, the copper-cobalt alloy plating presented high drilling rates as compared with the plating described in other examples and, as in the Example 5, it was supposedly attributed greatly to the surface roughening by the copper-cobalt alloy plating. According to that, it was found effective at improving the drilling rate to carry out roughening plating as to form nodule on the plated surface.

In Example 7, the drilling rates were 75% and 99% at laser beams radiation energy of 12.5 mJ/pulse and 20.9 mJ/pulse, respectively, and reached 100% at 32 mJ/pulse. There was no problem in practical manufacture and excellent drilling rates were shown. Consequently, the copper-phosphorus alloy plating was found effective to improve the drilling rates.

Also, as in the Example 1, as the cobalt-phosphorus deposition quantity was increased, the drilling rate was heightened. By controlling the deposition as to make cobalt deposition quantity exceeding 6,000 $\mu g/dm^2$, for example, the drilling rate was heightened to reach 100% even at 0.9 mJ/pulse.

In Example 8, the drilling rates were 0% and 82% at laser beams radiation energy of 12.5 mJ/pulse and 20.9 mJ/pulse, respectively, and reached 100% at 32 mJ/pulse. There was no problem in practical manufacture and excellent drilling rates were shown. Consequently, the nickel-phosphorus alloy plating was found effective to improve the drilling rates.

Also, as in the Example 1, as the nickel-phosphorus deposition quantity was increased, the drilling rate was heightened to be 100% at laser beams radiation energy of 12.5 mJ/pulse and 20.9 mJ/pulse, and excellently high drilling rates were thus shown.

In Example 9, the drilling rates were 99% at laser beams radiation energy of 12.5 mJ/pulse and reached 100% at 20.9 mJ/pulse, and 32 mJ/pulse and excellent drilling rates were thus shown.

This example was carried out by steps of copper-cobalt-nickel alloy plating (a first layer), further cobalt-nickel alloy plating (a second layer) thereon, and after that, carrying out chromium stabilizer treatment and it was found effective at improving the drilling rate without being greatly affected by the chromium stabilizer treatment (though the drilling rate tended to increase slightly).

Also, as in the Example 1, as the copper-cobalt-nickel alloy and/or cobalt-nickel alloy deposition quantity was increased, the drilling rate was heightened.

In Example 10, the drilling rates were 14% and 99% at laser beams radiation energy of 12.5 mJ/pulse and 20.9 mJ/pulse, respectively, and reached 100% at 32 mJ/pulse. There was no problem in practical manufacture and excellent drilling rates were shown. Consequently, the nickel-zinc alloy plating was found effective to improve the drilling rates.

Also, as in the Example 1, as the nickel-zinc deposition quantity was increased, the drilling rate was heightened to be 100% at laser beams radiation energy of even 20.9 mJ/pulse.

In Example 11, the drilling rates were 1% and 80% at laser beams radiation energy of 12.5 mJ/pulse and 20.9 mJ/pulse, respectively, and reached 100% at 32 mJ/pulse. There was no problem in practical manufacture and excellent drilling rates were shown. Consequently, the nickel-cobalt alloy plating was found effective to improve the drilling rates.

Also, as in the Example 1, as the nickel-cobalt deposition quantity was increased, the drilling rate was heightened. In the case where the nickel deposition quantity exceeded 7,000 $\mu g/dm^2$ and the cobalt deposition quantity exceeded 3,000 $\mu g/dm^2$, for example, the 100% drilling rate could be obtained at laser beams radiation energy of even 12.5 mJ/pulse.

In any example described above, excellent drilling rates were achieved even by low laser beams radiation energy. On the other hand, copper foils which were not subjected to the foregoing treatment and the specimens subjected to stabilizer treatment to add chromium and zinc as shown in the Comparative Example 1, presented low drilling rates, which were only 0%, 0%, and 9% at laser beams radiation energy of 12.5 mJ/pulse, 20.9 mJ/pulse, and 32 mJ/pulse, respectively. The rates could not reach 100% until the laser beams radiation energy was elevated as high as 43 mJ/pulse.

Since such high laser beams radiation energy, as described above, affects the insulated layer (resin) or other parts, the increase of the output is not desirable.

In such a manner, the Comparative Example 1 provided insufficient opening as a hole in a copper foil by laser beams According to the present invention, a copper foil easy to be laser-processed and suitable for forming through hole and via hole with a small diameter can be provided by forming a layer containing any one or more substances selected from indium, tin, cobalt, zinc, cobalt alloys, and nickel alloys on the face of a copper foil to be radiated with laser beams and a drilling rate can significantly be increased by relatively low laser beams radiation energy.

Consequently, the present invention provides a marked effect to directly form a hole and simply form through hole and via hole in a copper foil at the time of manufacturing a printed circuit board.

What is claimed is:

1. A perforated copper foil drilled by a laser beam, comprising:

a copper foil having a thickness of 18 μm or less, a laser beam irradiation face onto which a laser beam is directed to perforate said copper foil, and an opposite face for being adhered to a resin substrate; and a layer located on said laser beam irradiation face of said copper foil for being perforated with said copper foil and containing at least one substance selected from a group consisting of indium, tin, cobalt, zinc, cobalt alloys, copper alloys, and nickel alloys;

whereby said layer improves laser drilling processability of said copper foil.

2. A copper foil according to claim 1, wherein said layer contains a cobalt alloy which includes at least one of nickel, phosphorus, zinc and copper.

3. A copper foil according to claim 1, wherein said layer contains a nickel alloy which includes at least one of copper, zinc and phosphorus.

4. A copper foil according to claim 1, wherein a content of each of said substances contained by said layer is in a range of 0.1 to 100 mg/dm$^2$.

5. A copper foil according to claim 4, wherein said substance includes zinc content of zinc contained by said layer is in a range of 0.5 to 100 mg/dm$^2$.

6. A method for manufacturing a copper foil which has excellent laser drilling processability, comprising the steps of:

obtaining a copper foil having a thickness of 18 μm or less, said copper foil having a laser beam irradiation face and an opposite face for being adhered to a resin substrate;

forming a layer on said laser beam irradiation face of said copper foil, said layer containing at least one substance selected from a group consisting of indium, tin, cobalt, zinc, cobalt alloys, copper alloys, and nickel alloys; and perforating said copper foil and layer with a laser beam after said forming step.

7. A method according to claim 6, wherein said substance contained by said layer is a cobalt alloy containing at least one of Nickel, phosphorus, zinc, and copper.

8. A method according to claim 7, wherein said step of forming said layer on said copper foil is accomplished by plating said layer on said copper foil.

9. A method according to claim 8, further comprising a step of treating said copper foil with a stabilizer treatment after said forming step.

10. A method according to claim 6, wherein said substance contained by said layer is a nickel alloy containing at least one of copper, zinc, and phosphorus.

11. A method according to claim 10, wherein said step of forming said layer on said copper foil is accomplished by plating said layer on said copper foil.

12. A method according to claim 11, further comprising a step of treating said copper foil with a stabilizer treatment after said forming step.

13. A method according to claim 6, wherein said step of forming said layer on said copper foil is accomplished by plating said layer on said copper foil.

14. A method according to claim 13, further comprising a step of treating said copper foil with a stabilizer treatment after said forming step.

15. A method according to claim 14, wherein said stabilizer treatment includes treating said copper foil with at least one of chromium and zinc.

16. A method according to claim 6, wherein a content of each of said substances contained by said layer is in a range of 0.1 to 100 mg/dm$^2$.

17. A method according to claim 16, wherein said substance includes zinc and wherein a content of zinc contained by said layer is in a range of 0.5 to 100 mg/dm$^2$.

18. A method according to claim 6, further comprising a step of treating said copper foil with a stabilizer treatment after said forming step.

19. A method according to claim 18, wherein said stabilizer treatment includes treating said copper foil with at least one of chromium and zinc.

20. A copper foil according to claim 1, wherein said layer is made of a copper alloy containing at least one of nickel, cobalt, chromium and zinc.

21. A method according to claim 6, wherein said layer is made of a copper alloy containing at least one of nickel, cobalt, chromium and zinc.

* * * * *

UNITED STATES PATENT AND TRADEMARK OFFICE
CERTIFICATE OF CORRECTION

PATENT NO. : 6,638,642 B2
DATED : October 28, 2003
INVENTOR(S) : Kitano et al.

It is certified that error appears in the above-identified patent and that said Letters Patent is hereby corrected as shown below:

Column 5,
Line 31, "2 to 10 ug/L," should read -- 2 to 10 g/L. --

Column 11,
Line 27, "zinc content" should read -- zinc and wherein a content --

Signed and Sealed this

Sixth Day of April, 2004

JON W. DUDAS
*Acting Director of the United States Patent and Trademark Office*